(12) United States Patent
Ikeya et al.

(10) Patent No.: US 6,848,928 B2
(45) Date of Patent: Feb. 1, 2005

(54) SOCKET

(75) Inventors: Kiyokazu Ikeya, Shizuoka (JP); Hideki Sano, Gotenba (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/301,191

(22) Filed: Nov. 21, 2002

(65) Prior Publication Data

US 2003/0100201 A1 May 29, 2003

(30) Foreign Application Priority Data

Nov. 29, 2001 (JP) ......................................... 2001-363950

(51) Int. Cl.[7] .............................................. H01R 13/62
(52) U.S. Cl. ........................................ 439/331; 439/330
(58) Field of Search ............................... 439/70, 71, 73, 439/330, 331

(56) References Cited

U.S. PATENT DOCUMENTS

| | | | | |
|---|---|---|---|---|
| 5,320,550 A | * | 6/1994 | Uratsuji et al. | 439/266 |
| 5,865,639 A | * | 2/1999 | Fuchigami et al. | 439/330 |
| 6,280,219 B1 | * | 8/2001 | Sano et al. | 439/268 |
| 6,322,384 B1 | | 11/2001 | Ikeya | |
| 6,666,691 B2 | * | 12/2003 | Ikeya | 439/71 |

* cited by examiner

*Primary Examiner*—Thanh-Tam Le
(74) *Attorney, Agent, or Firm*—Russell E. Baumann; Frederick J. Telecky, Jr.

(57) ABSTRACT

A test socket 10 of the present invention includes a base member 20, a cover member 30 which is installed on base 20 to move in reciprocal straight line movement between a first position away from the base and a second position adjacent the base and a plurality of contact members 40 that are fixed in the base and are capable of making contact with terminals 2 on a semiconductor device 1 when such device 1 is mounted on base 20. A latch member 60 is supported on base 20 in a rotatable manner to move in linkage with the movement of cover member 30. A compression member 80 is pivotably attached to a tip portion 62 of latch member 60 for pressing semiconductor part 1 onto base 20 to achieve reliable contacting between terminals 2 and contacts 40 in response to movement of cover member 30. This socket design will provide for wide area engagement between the surface of semiconductor part 1 and compression member 80 to prevent damage to the semiconductor part 1 during testing.

10 Claims, 9 Drawing Sheets

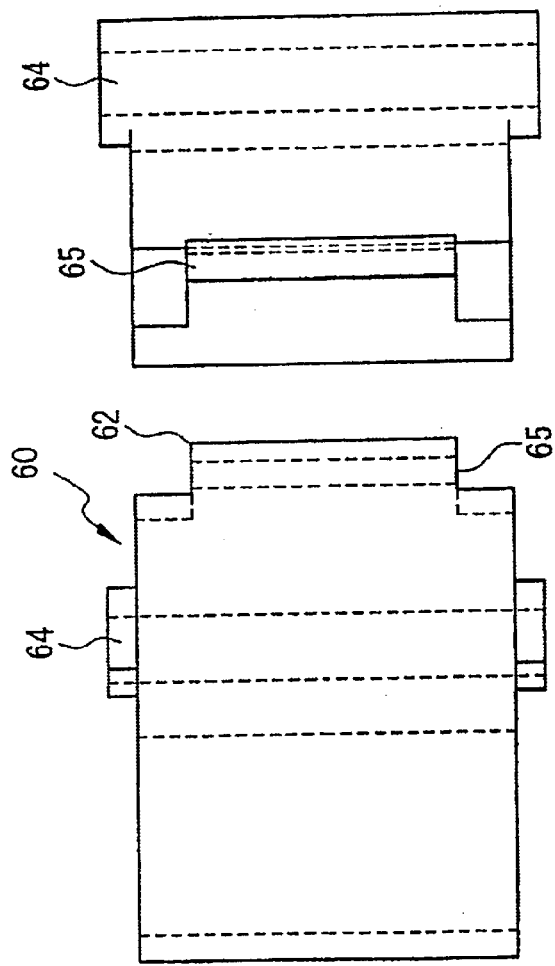
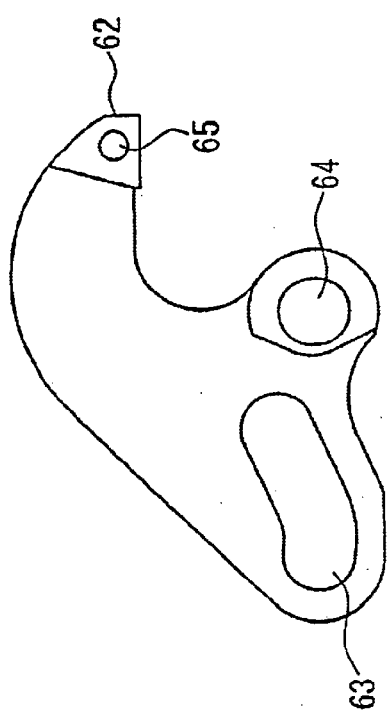
FIG. 4A
FIG. 4B
FIG. 4C

SOCKET

FIELD OF THE INVENTION

This invention relates to a socket for mounting an electronic part such as a semiconductor part to external equipment.

BACKGROUND OF THE INVENTION

It has been known in the art to check for defects in semiconductor devices such as integrated circuit (IC) devices by subjecting them to a burn-in test. In connection with such a burn-in test, the semiconductor device is mounted on a socket for connecting the device to a test piece of equipment. A commonly used socket is a pop-up type which has a cover member which moves in alternating motion from a first original position away from the main base body of the socket to a second position adjacent the main base and then back again to the first position. Such a socket with straight line movement of the cover relative to the socket base is suitable for automatic mounting of a semiconductor device.

In the main base body, a plurality of contact members is mounted. One end of each contact member protrudes from the bottom of the main socket body so as to be electrically connected with a contact on a circuit substrate while the other end is positioned to electrically connect with a terminal of a semiconductor device mounted on the main base body. On the opposing sides of the semiconductor device placing surface of the main base body, a pair of latch members is installed with each latch member rotating in linkage with the straight-line movement of the cover member. At the tip of the latch member, a pressing part is provided for holding down the semiconductor device on the placing surface of the main base body.

In such a prior art device, as the cover is pushed downward toward the base body, the latch members are rotated to a retracted position away from the placing surface for the semiconductor device. In this position, the semiconductor device can be placed on the placing surface through an opening provided in the cover member. Each terminal of the semiconductor device is positioned to be electrically connected with the other end of the socket contact members. When the cover is returned to its original position away from the main base, the latch members return to their original position so as to press against the upper surface of the semiconductor and, at the same time, bring the terminals of the semiconductor device into electrical connection with the contact members of the socket.

Such a socket has been useful in practice but due to the fact that the latch member moves in a rotating arc, the area of contact between the pressing part of the respective latch members and the upper surface of the semiconductor device is small. As a consequence, a localized stress concentration is produced by the latches on the semiconductor device which can cause breakage of such semiconductor devices, especially one of a thin type.

Reliability problems can still exist even when the pressing part of the latch member is flat. This is due to the fact that the rotary movement of the latch causes its pressing part to draw an arc shaped track which makes it difficult to make a precise contact between the flat surface of the pressing part and the upper surface of the semiconductor device.

Further, due to dimensional tolerance differences in the semiconductor devices, the upper surface of such devices is not always at a fixed height making it practically impossible to cause the pressing part of the latch member to uniformly and consistently contact the semiconductor device at all times.

Still further, since the socket is exposed to elevated temperatures (approximately 135° C.) during the burn-in test, the variance of thermal expansion of different components of the socket will make it practically impossible to cause the pressing part of the latch member to accurately contact the upper surface of the semiconductor device at a height certain at all times.

SUMMARY OF INVENTION

Accordingly, it is an object of this invention to provide a socket to overcome the problems of the prior art devices.

It is yet another object of this invention to provide a socket which is capable of accurately mounting a semiconductor device, especially of the thin type without damaging it.

It is still another object of this invention to provide a socket which is suitable for automatic mounting of a semiconductor device and which has superior operability and economy.

Briefly, the present invention provides for a socket for use with a semiconductor device having a top surface and a bottom surface with a plurality of terminals on the bottom surface comprising a base, an adaptor member received on the base having a seating surface for said semiconductor device, the adaptor member having a plurality of contact member receiving holes extending through the seating surface, a cover which is arranged on the base and supported for straight line movement between a first position in which it is apart from the base and a second position in which it is adjacent the base, a plurality of contact members having tips received in each of the contact member receiving holes to be placed in contact with each terminal of the semiconductor device placed on the seating surface, and a rotary latch member having a rotational axis fixed to the base being movable in conjunction with the movement of said cover member, said latch member having a tip portion onto which a compressive part member is mounted so as to be able to pivot with regard to said tip portion, said pivoting compressive part member being positioned to be capable of pressing said semiconductor device against said seating surface when said semiconductor device is on said seating surface and said cover member is in said first position for providing reliable electric contact between said plurality of terminals and said plurality of contact members while not damaging said semiconductor device due to said compressive part number making wide area contact with said top surface of said semiconductor device.

In another embodiment of the present invention, the socket includes rotatable holding members to work in conjunction with latch members to provide wide area contact by the holding member with the semiconductor device being tested with socket.

BRIEF DESCRIPTION OF THE DRAWINGS

Other objects, advantages and details of this invention appear in the following detailed description of the preferred embodiments of the invention, the detailed description referring to the drawings in which:

FIG. 4 show the latch member of FIGS. 2 and 3 where (a) is a top plan view, (b) is a front view and (c) is a side view;

DETAILED DESCRIPTION OF THE PREFERRED EMBODIMENTS

Figure 1A:
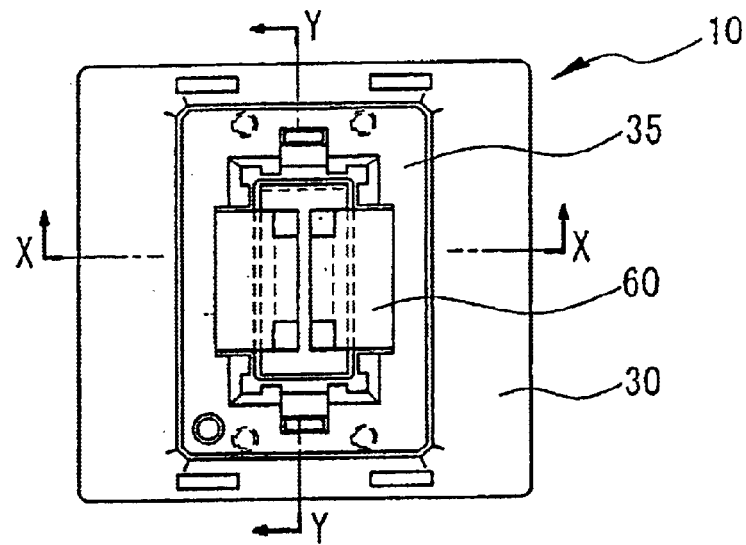
FIG. 1 shows a socket according to a first embodiment of this invention, where (a) is a top plan view, (b) is a front view, and (c) is a side view.
Figure 1B:
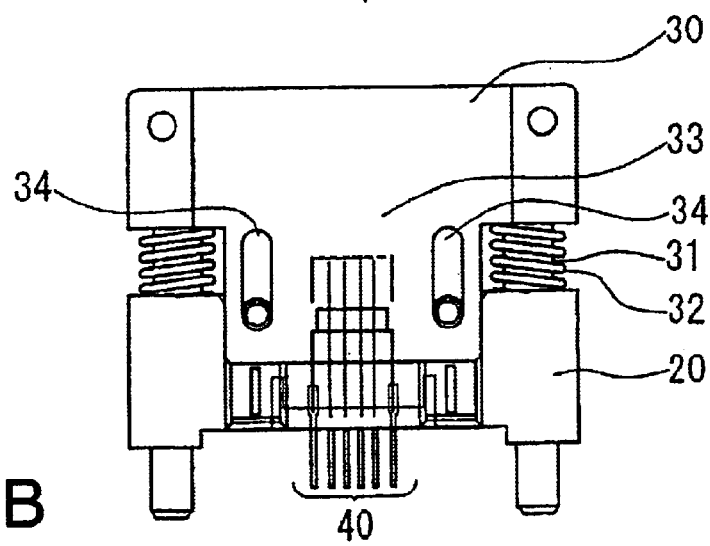
Figure 1C:
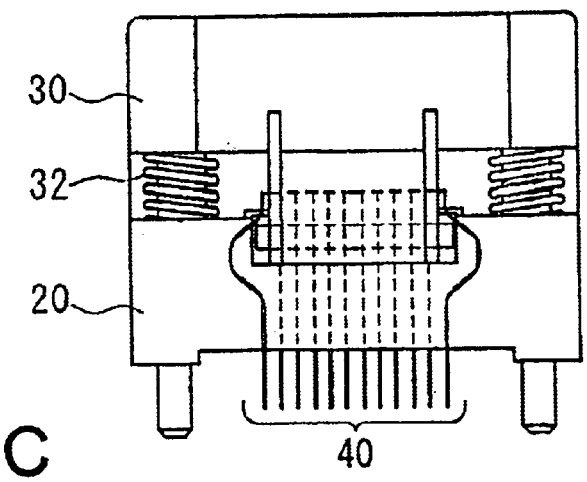
Figure 2:
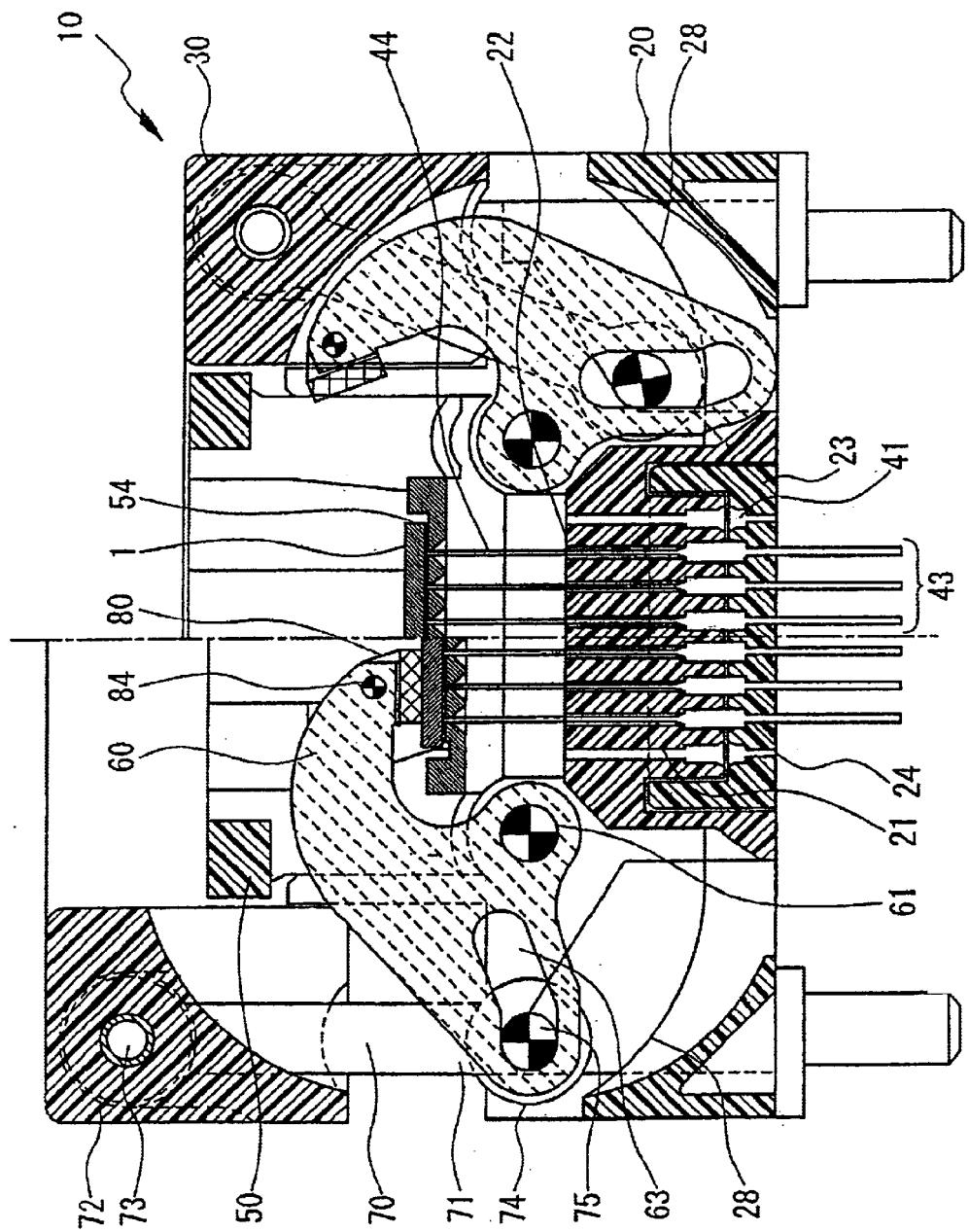
FIG. 2 shows a cross-sectional view cut along line X—X of FIG. 1 (a) showing the cover member in the upper position, free state and in the lower position, depressed state.
Figure 3:
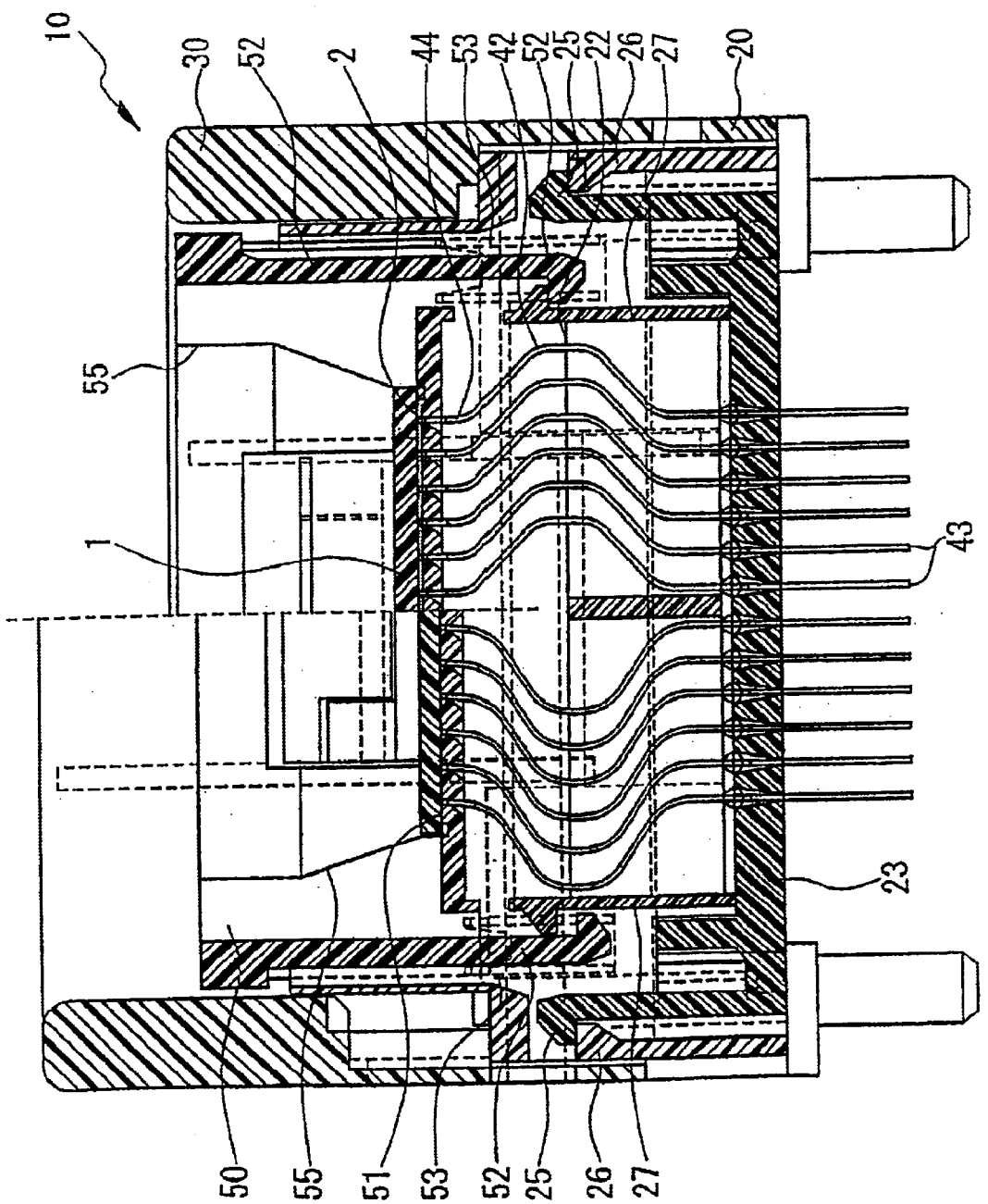
FIG. 3 shows a cross-sectional view cut along line Y—Y of FIG. 1(a) showing the cover member in the upper position free state and in the lower position depressed state.

As shown in FIGS. 1–3, a socket 10 of the present invention is provided for testing a semiconductor device 1 of the Land Grid Array (LGA) type. Such LGA device 1 contains a plurality of terminals 2 that are two-dimensionally arranged at a pitch, by way of example, of 0.75 millimeters on the lower surface with each terminal having a contact region at a concave location slightly inside of its lower surface.

Socket 10 has a base member 20 and a cover member 30 in which cover member 30 is capable of moving in an alternating motion between a position away from base member 20 and a position generally adjacent base member 20. Base member 20 is formed of electrically insulating material preferably by injection molding a high heat resistant ether sulfone or the like. Approximately, at the center of base member 20 there are provided a plurality of slots 21 for receiving and enclosing a plurality of contact members 40 in rows parallel with the Y—Y line. Each slot 21 is separated by a partition wall in the direction of line X—X. The partition wall extends from the lower of base member 20 to an adaptor installation surface 22.

A stopper member 23 is installed at the bottom part of base member 20 for the prevention of the possible withdrawal of contacts 40. A plurality of through-holes 24 are provided in conformity with the arrangement of contacts 40. A hook member 25 is arranged on the sides of stopper member 23 and is positioned to contact engaging part 26 of base member 20.

Contacts 40 are typically formed by punching them out of a strip of metal material. The contacts have a base portion 41 secured in stopper member 23 which is wider than an upper upwardly extending intermediate curved part 42. Extending downward from base portion 41 of contact 40 and protruding from the bottom of socket 10 is a leg portion 43 which is provided for making electrical contact with a circuit substrate (not shown). Extending up from intermediate curved part 42 of contact 40 is a contacting portion 44 which protrudes from adaptor installation surface 22 to make electrical contact with a selected terminal 2 of LGA device 1. In this embodiment, the distal end of contacting portion 44 has a rounded shape so as to not damage terminal 2 when contact is made between contacting portion 44 and terminal 2. Curved portion 42 of contact 40 provides an elastic force that opposes the application of a compressive load in the axial direction against contacting portion 44.

Prior to the installation of stopper member 23 on base member 20, each contact 40 is inserted in its respective slot 21 from the under side of base 20. As the base portion 41 of each contact 40 engages the partition wall of slot 21, the further insertion of the contact is prohibited. Next, stopper member 23 is affixed on base 2 with each leg portion 43 of contact 40 passing through a respective through-hole 24 of stopper member 23 so as to fix contacts 40 in base member 20.

An adaptor member 50 is installed on adaptor installation surface 22 so as to move up and down thereby providing a placing surface 51 for the receipt of LGA device 1. A pair of hooks 52 is provided on both sides of adaptor 50 and positioned so as to be able to engage an engagement part 27 of base member 20. A coil spring 53 is wound around each hook 52 of adaptor 50 to thereby bias the adaptor 50 in an axial direction away from base 20. When a force greater than that of coil springs 53 is applied, adaptor 50 will move in opposition to coil spring 53.

On placing surface 51 of adaptor 50, a plurality of apertures 54 are formed at positions that correspond to each contact 40 or slot 21 of base member 20 with contacting portion 44 of each contact extending through apertures 54. At the time when adaptor 50 is at its at rest uppermost position due to the force of coil springs 53, the contacting position 44 of each contact 40 remains inside aperture 54 without protruding from placing surface 51; its position being slightly below the placing surface 51.

In accordance with this embodiment, a guide 55 including an inclined surface is formed around placing surface 51 of adaptor 50 so that the LGA device 1 can be easily and accurately positioned on placing surface 51.

At each corner of cover member 30, there is provided a post 31 which extends downward to be received into an aperture (not shown in the drawings) that is formed at each corner of base member 20. a coil spring 32 is wound around each post 31 between cover member 30 and base member 20 to bias cover member 30 to a position away from base member 20. Additionally, cover member 30 has opposing side walls 33 with each having a pair of slots 34 formed therein. These slots work with a rotary shaft 61 of latch member 60 which will be discussed in detail below.

Slots 34 guide the movement of cover member 30 in the upward and downward direction. At the time rotary shaft 61 touches the lowest point of slot 34, cover member 30 is at a position which it is farthest away from base member 20. At the time when rotary shaft 61 touches the highest part of slot 34, cover member 30 is at a position which is closest to the base member 20.

A rectangular opening 35 is formed generally at the center of cover member 30 so as to provide for the insertion of LGA device 1 along guide member 55 of adaptor 50 onto placing surface 51.

A pair of latch members 60 is installed freely rotatably on rotary shaft 61 anchored in base member 20 as shown in FIG. 2. Latch members 60, as shown in FIG. 4, have a tip or pressing part 62 for pressing LGA device 1 onto placing surface 51. A link member 70 is arranged on both sides of the pair of latch members 60. A second shaft is provided at the lower end 71 of link member 70 which is received in an elongated slot 63 of latch member 60. A top end 72 of link 70 is rotatably supported by a shaft 73 mounted in cover 30.

Lower end 71 of link 70 has an arc shaped outer peripheral surface 74 which is provided for sliding on a cam surface 28 that is formed in base member 20.

When cover member 30 is moved from its at rest position toward base member 20, with the arc-shaped outer peripheral surface 74 of link 70 riding on cam surface 28, link 70 begins its rotation with shaft 73 as its center and shaft 75 of link 70 moves within elongated slot 63. This action causes latch member 60 to rotate around shaft 61 as it center thereby moving the tip 62 of each latch member 60 in an outward arc from a first position which is adjacent or in touch with adaptor 50 to second position away from adaptor 50 as shown in FIG. 2.

Figure 5C:
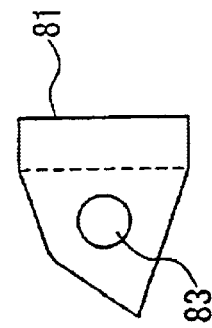
FIG. 5 shows the contacting part of the latch member of FIG. 4 which (a) shows a plan view, (b) shows a front view and (c) shows a side view.
Figure 5A:
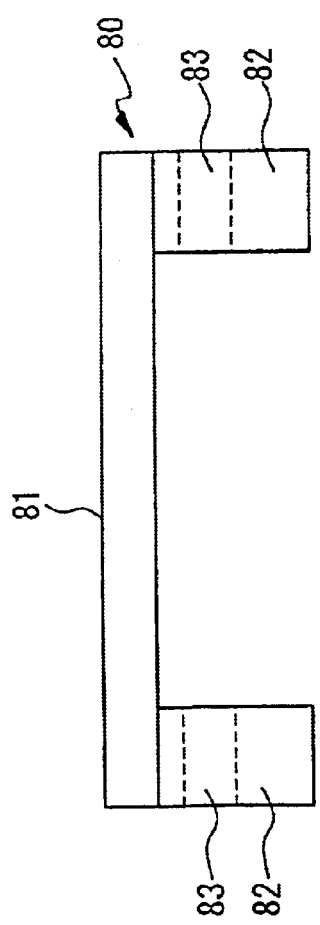
Figure 5B:
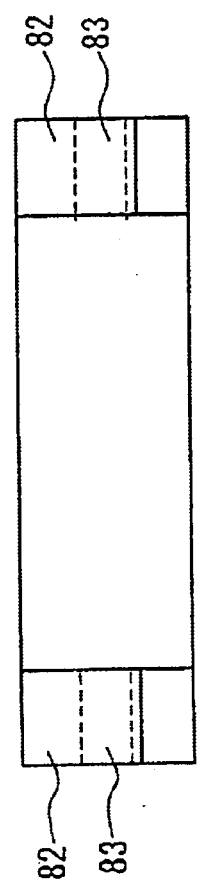

FIG. 4 shows in detail the construction of the latch member and FIG. 5 shows the construction of a pivoting contacting member 80 which is installed on the latch member. In this embodiment, latch member 60 has a through hole 64 for accommodating a rotary shaft 61 mounted in base member 20. In addition, a through hole 65 is provided in the tip portion 62 of latch 60 for receiving a shaft 84 for installing contacting member 80 on tip portion 62 of latch 60. Contacting member 80 has a pressing face 81 with a flat surface in its longitudinal direction and an installation part 82 extending from both sides of pressing surface 81 in which an installation hole 83 is formed.

A shaft 84 is passes through hole 65 of latch 60 and installation holes 83 of contacting member 80 in a manner such that contacting member 80 is attached to tip portion 62 of latch 60 so as to be freely rotatable. It is desirable that installation holes 83 have a diameter which is larger than that of shaft 84, thereby making it possible for contacting member 80 to have "play" in the axial direction and the perpendicular direction of shaft 84, in addition to the rotary movement of contacting member 80.

On both sides (in the vertical direction toward the surface of the sheet in FIG. 2) of latch member 60, the respective links 70 are arranged with shaft 75 being installed at one end 71 running through the elongated hole 63 of latch member 60.

With regard to the installation of contacting member 80 on latch member 60, the above described method is by way of example and other methods could be used. For example, it is possible to form a shaft integrally at tip 62 of latch member 60 with contacting member 80 being installed on this shaft without forming the through hole 65 on latch member 60. In this construction, at least one of the installation parts 82 of contacting member 80 is made to be removable from the contacting member itself for the insertion of the shaft. Once again, it is desirable that the size of installation hole 82 is made larger than the diameter of the shaft, thereby providing for multi axial movement of contacting member 80.

Separately from what has been described above, a shaft may be formed integrally on the axial installation part 82 of contacting member 80 with latch member 60 being provide thereon. Also, in this case, it is desirable that at least one of the installation parts 82 be constructed to be able to be removed from contacting member and that for the same reason, the hole of the latch member be made larger than the diameter of the shaft.

The operation of loading a semiconductor device 1 will be explained below:

At the time when cover member 30 is in the state of being apart from base member 20 by the force of springs 32, the pressing surface 81 of contacting member 80 attached to latch member 60 is in contact or directly adjacent placing surface 51. If the cover member is pushed down for the purpose of mounting a LGA device on the socket, the downward movement of link 70 and correspondingly the movement of arc shaped outer peripheral part 74 along cam surface 28 caused latch member 60 to rotate around rotary shaft 61 to position tip 62 of latch member 60 in a retracted position. This allows for the insertion of the LGA device 1 through the opening 35 of the cover.

LGA device 1 is positioned on placing surface 51 of adaptor 50 using guide 55 to help with the accurate positioning (the state as shown in the half portion of FIGS. 2 and 3). Subsequent to the placement of LGA device 1 on adaptor 50 and the removal of the downward force on cover member 30, cover member moves away from base member 20 due to the force of springs 32 with the result that lower end 71 of link 70 moves outwardly from the socket center and latch 60 starts rotating to the position where tip 62 is adjacent LGA device 1 on adaptor 50.

At near the end of the rotation of latch 60, a part of pressing surface 81 of contacting member 80 attached to tip 62 touches the top surface of LGA device 1. Since contacting member 80 in a free state is capable of pivoting with relation to tip 62 of latch member, the pressing surface 81 sways/pivots so as to align with the upper surface of the LGA device 1, with the consequence that pressing surface 81 as a whole makes contact with the device surface.

As the cover member finishes its upward movement, latch member 60 rotates to its final position with the result that LGA device 1 is pressed down by the pressing surface of contact member 80. This results in moving adaptor 50 downward due to the downward force of latch member 60 being greater than the upward biasing force of springs 53.

Almost simultaneously with the above actions, terminals 2 on the lower surface of LGA device 1 move into contact with contacting portion 44 of contacts 40 as they protrude out of through holes 54. With the cover at its upper most position, a balance is reached between the pressing force exerted against LGA device 1 and the spring force of contacts 40. This balanced position is set so that there is proper contacting force for all terminals 2 with respective contacts 40 (refer to state shown in the left half in FIGS. 2 and 3).

These series of contacting movements by latch member 60, and more particularly tip 62, with respect to LGA device 1 are arc-shaped movements. The free pivoting rotation of contacting part 80 attached to tip 62 allows for the pressing surface 81 to make wide area contact as if in a straight line movement with the top surface of LGA device 1.

In accordance with this invention, both the pressing force from the latch members 60 and the counter force from contacts 40 work on the LGA device 1. As the lower surface of LGA device 1 is supported by the placing surface of adaptor 50, while its upper surface is pressed by pressing surface 81 of contacting members 80, any concentration of stress totally at specific points on the LGA device, or the application of twisting or shearing force, is at an absolute minimum with the consequence that possible damage to the semiconductor device is prevented.

Next, alternative embodiments of the present invention will be explained below which use different examples of latch members and contacting members for uniformly holding LGA device 1.

Figure 6:
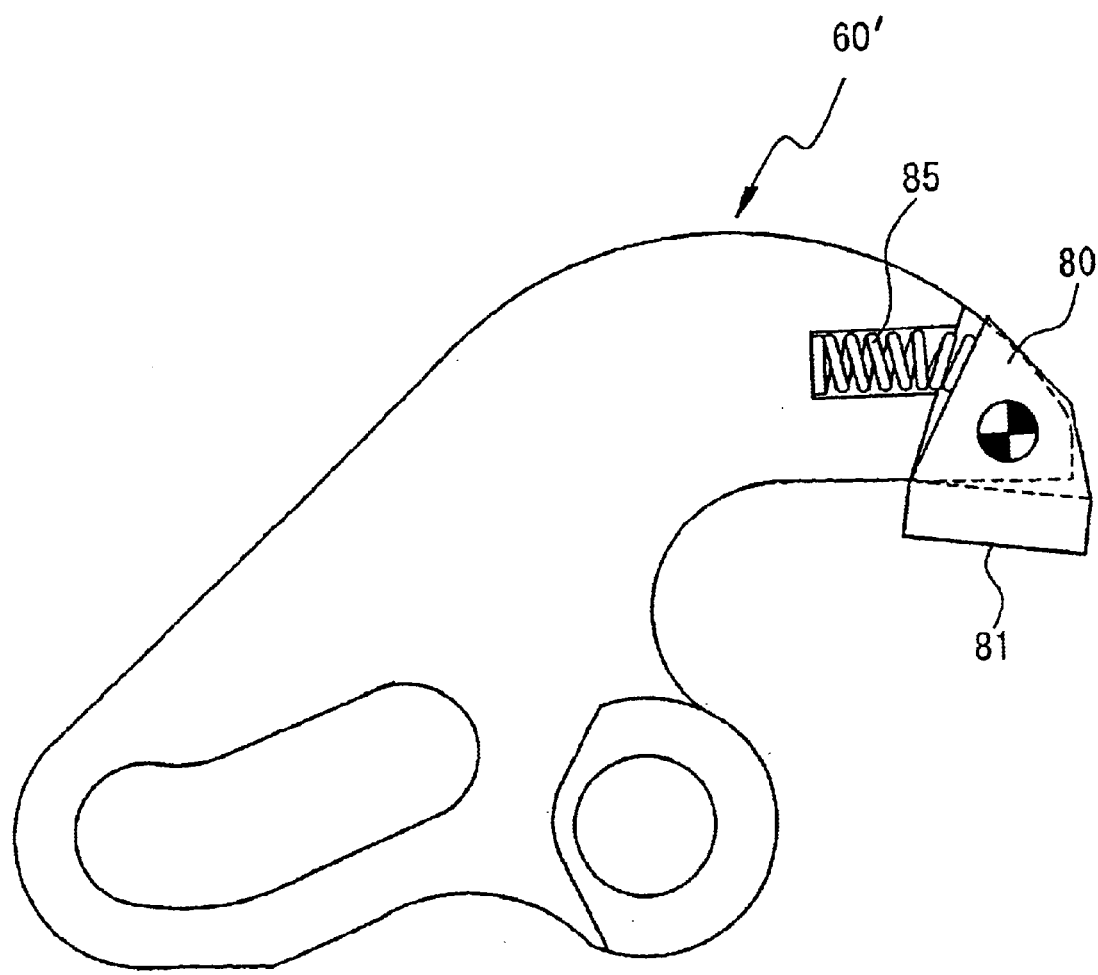
FIG. 6 shows a latch member of a second embodiment.

As is shown in FIG. 6, there is shown a latch member 60' to be used in place of the latch member 60 described above. In this second embodiment the contact member 80 is biased away from latch member 60' by an elastic member such as a spring member 85 interposed between latch member 60' and contacting member 80. With this construction, it becomes possible for contacting member 80 to make stable contact in a fixed direction at all times when it contacts the upper surface of LGA device 1.

Figure 7:
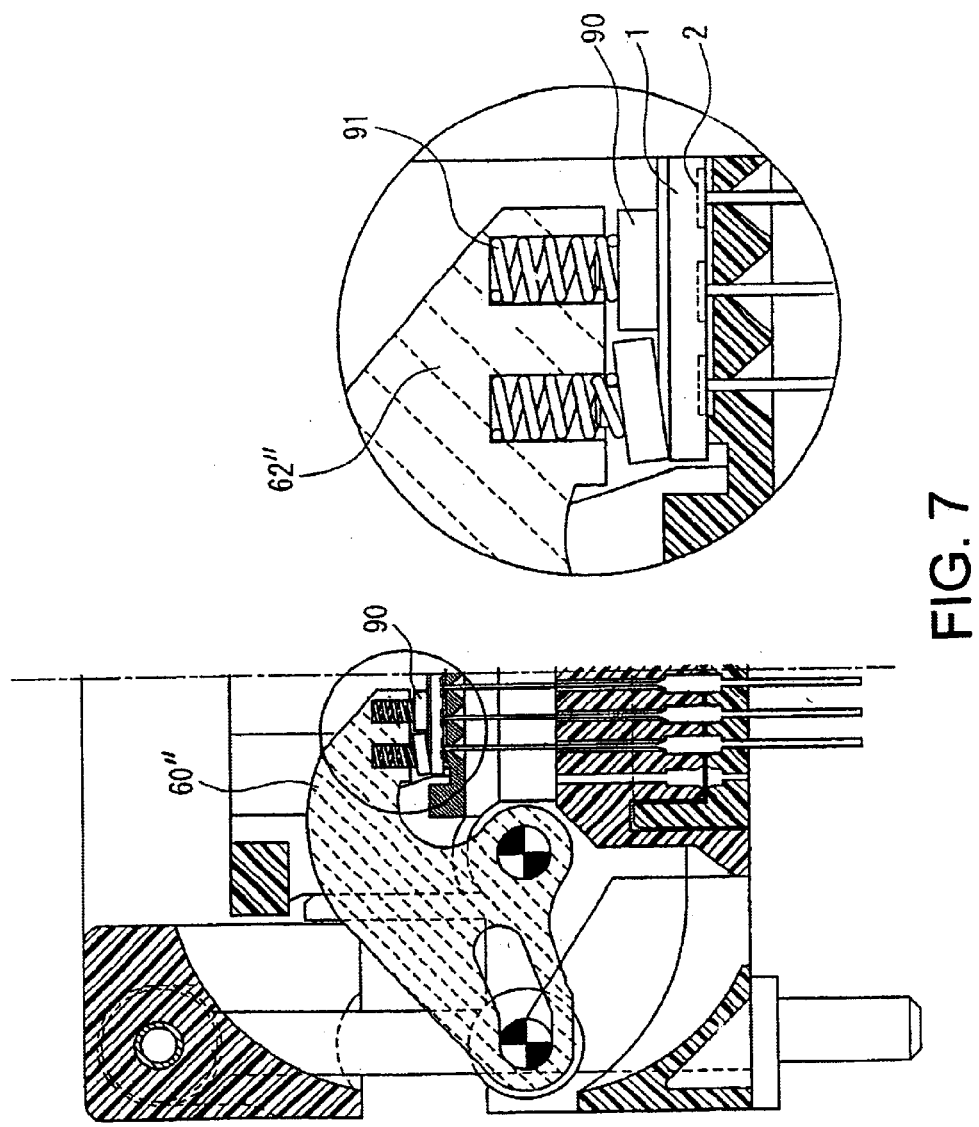
FIG. 7 shows a partial front cross-section view of a third embodiment of this invention with an enlarged view of the contacting part of this third embodiment latch member.

FIG. 7 shows a third embodiment of the present invention with a modified latch member 60" to be used with two or more pressing plates 90 mounted in a tip portion 62" of latch member 60". More specifically, notches are provided in tip portion 62" to house spring members 91. At the end of each spring member 91, the pressing plates 90 are attached so as to be able to pivotally move around the axis of the spring member. Thus, upon the cover member returning to its upper most position, each individual pressing plate member 90 will contact the upper surface of LGA device 1 on a wide area due to the pivoting movement of the pressing plates.

Figure 8:
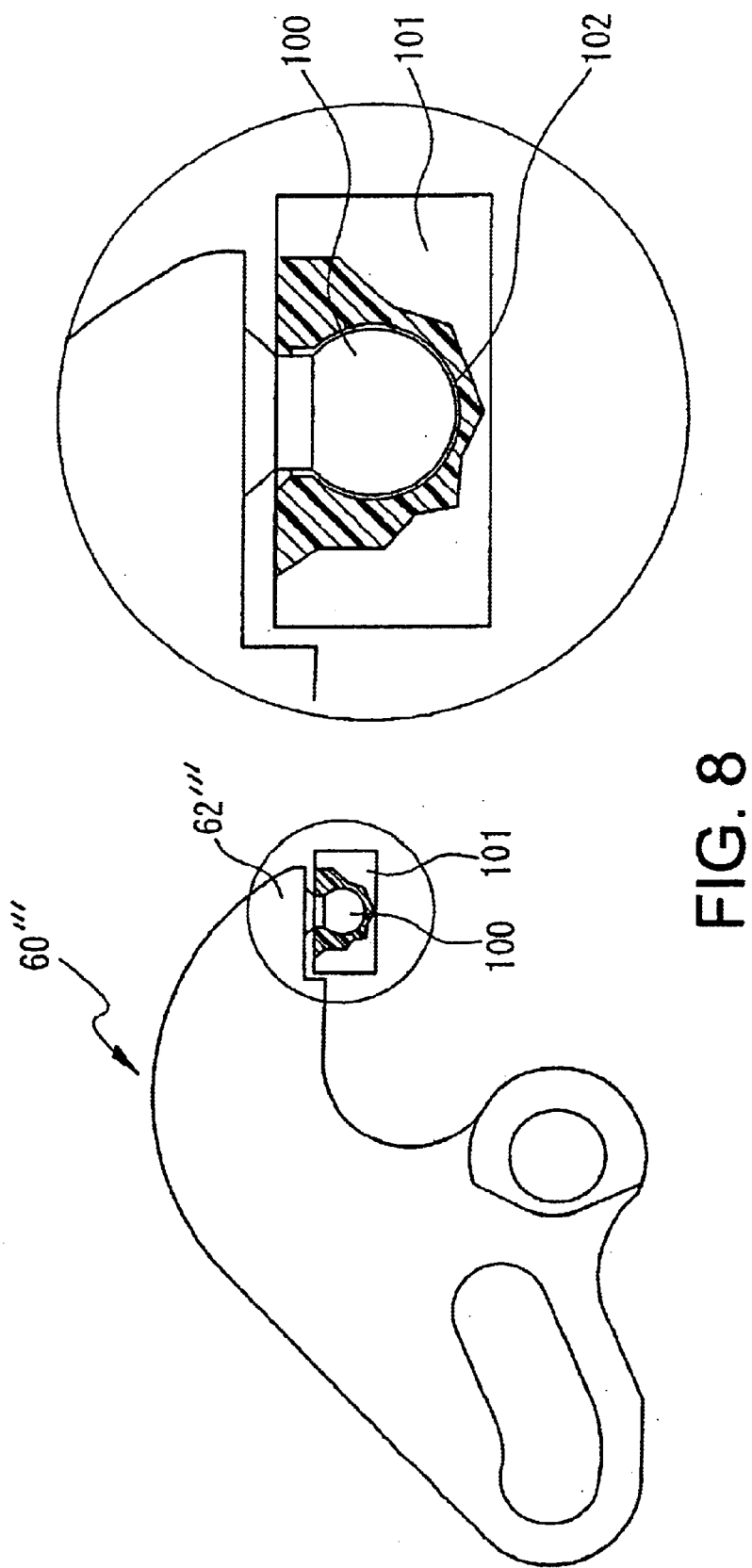
FIG. 8 shows a latch member of a fourth embodiment of this invention.

FIG. 8 shows a fourth embodiment of the present invention with yet still another design of a contacting member mounted to a latch member at its tip portion. In this case, a spherical member 100 is attached to tip portion 62''' of latch member 60'''. A contacting member 101 having a circular cavity 102 is in turn rotatably mounted on spherical member 100. There is a clearance area provided between contacting member 101 and tip 62''' of latch member 60''', thereby making it possible for the pivoting movement of contacting member 101 around spherical member 100. With this construction, there is an advantage in that the contacting member 101 is installed on latch member 60''' using a minimum number of parts. It would also be possible to make the spherical member as part of the contacting member and the circular cavity as part of latch member 60''' or use an elastic rubber joint, etc.

Figure 9:
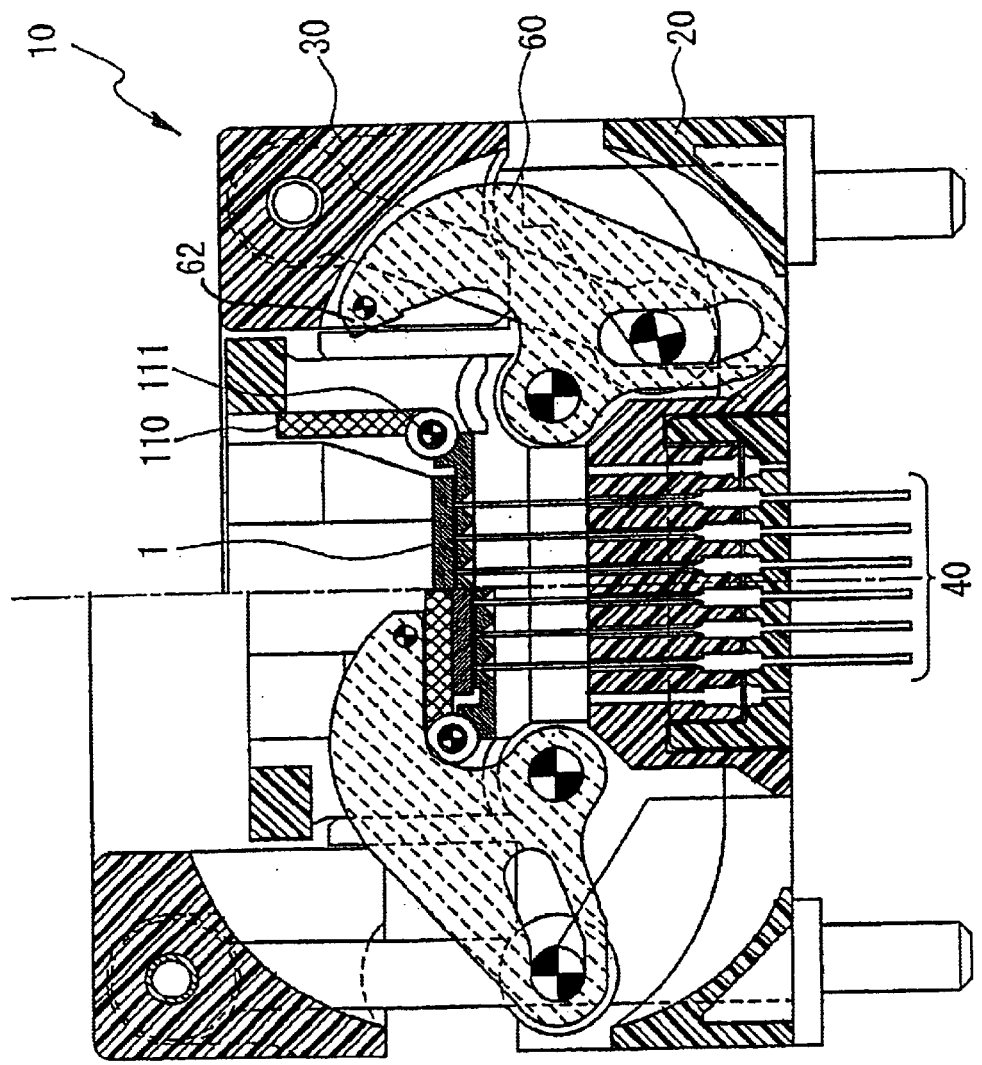
FIG. 9 shows a front cross-section view of a socket of a fifth embodiment of this invention with cover member in the upper position, free state and in the lower position, depressed state.

FIG. 9 shows a fifth embodiment of the present invention using a pair of separate holding members 110 instead of using a pivoting/rotating member at the tip of latch member 60. The holding members 110 are installed on base 20 close to the inner side of latch member 60 on the side that faces adapter 50. An elongated hole is formed at one end of holding plate 110 for receiving a rotary shaft 111 to thereby make it possible for holding plate 110 to be able to rotate to contact adapter 50 or LGA device 1 when placed on adapter 50 in response to movement of latch member 60. Even if the thickness of device 1 may change, the holding plate 110 moves in a generally perpendicular direction to shaft 111 in conformity therewith, making it possible to effect contact with the upper surface of LGA device 1 in a wide area.

In operation, after the placement of LGA device 1 on placing surface 51 of adaptor 50 (in the state shown in the right-side half in FIG. 9), cover member 30 is elevated and latch member 60 is rotated. In this situation, the holding plates 110 come into contact with the upper surface of LGA device 1 as they are moved by latch members 60. Accordingly, latch member 60 presses holding plate 110 and in the turn upper surface of device 1 (in the state shown in the left-side half in FIG. 9). By using holding plates 110, the area of contact can be increased and, at the same time, a latch member of conventional construction can be used as it is. Holding plates 110 may also be used in conjunction with spring members to bias them away from the surface of adaptor 50.

Some desirable embodiments of this invention have been described above in detail. It is pointed out, however, that this invention is not to be restricted by the forms of the specific embodiments mentioned, but that it can be modified in various ways within the range of the essence of this invention that has been described in the scope of claims below.

For example, a pair of latch members at opposing locations with reference to the adaptor has been used in the various embodiments described above. However, the latch member with contacting member may be arranged on only one side, by way of example, or on all four sides. Additionally, the invention has been described with reference to a semiconductor device of LGA type, but other conductor device types such as ball grid array devices can also be used. Even the general shape of the contact members may be varied and not be limited to the one shown.

This invention has been described for sockets of the so-called "pop-up" type. The movement means from the cover member to the latch member has been a link mechanism, but it could also be other mechanisms such as a cam means as are known in the art. This invention is applicable to any type of socket where the semiconductor device is pushed down by a latch member which is connected to the straight line movement of the cover member.

What is claimed:

1. A socket for use with a semiconductor device having a top surface and a bottom surface with a plurality of terminals on a bottom surface comprising a base, an adaptor member received on the base having a seating surface for said semiconductor device, the adaptor member having a plurality of contact member receiving holes extending through the seating surface, a cover which is arranged on the base and supported for straight line movement between a first position in which the cover is apart from the base and a second position in which the cover is adjacent to the base, a plurality of contact members having tips received in each of the contact member receiving holes to be placed in contact with each terminal of the semiconductor device placed on the seating surface, and a rotary latch member having a rotational axis fixed to the base being movable in conjunction with the movement of said cover member, said latch member having a tip portion onto which a compressive part member is mounted so as to be able to pivot with regard to said tip portion, said compressive part member being positions to be capable of pressing said semiconductor device against said seating surface when said semiconductor device is on said seating surface and said cover member is in said first position for providing reliable electric contact between said plurality of terminals and said plurality of contact members while not damaging said semiconductor device due to said compressive part member marking wide area contact with said top surface of said semiconductor device.

2. A socket according to claim 1 wherein said compressive part member contains a shaft that is installed at said tip portion of said latch member and a contacting member joined to said shaft so as to be fully rotatable thereon, said contacting member having a pressing surface for engagement with the top surface of said semiconductor device.

3. A socket according to claim 2 wherein said contacting member has a hole that accommodates said shaft with said hole being larger than the diameter of said shaft.

4. A socket according to claim 3 wherein said hole is an elongated hole.

5. A socket according to claim 1 wherein said compressive part member is biased in one direction by a spring member.

6. A socket according to claim 1 wherein said compressive part member includes a spherical member that is formed at the tip of said latch member and a contacting member that is joined to said spherical member so as to be fully rotatable thereon, said contacting member having a pressing surface for engagement with the top surface of said semiconductor device.

7. A socket according to claim 1 wherein said latch member rotates in linkage with the movement of said cover member.

8. A socket according to claim 1 wherein said adaptor member is biased toward said cover member by a spring.

9. A socket according to claim 8 wherein said adaptor member is displaced at the time said semiconductor device is pressed by said compressive part member.

10. A socket according to claim 1 wherein said semiconductor device has a plurality of two dimensionally arranged terminals on the bottom surface of the semiconductor device.

* * * * *